United States Patent
Lin

(10) Patent No.: US 8,381,799 B2
(45) Date of Patent: Feb. 26, 2013

(54) HEAT RADIATING UNIT

(75) Inventor: Sheng-Huang Lin, Sinjhuang (TW)

(73) Assignee: Asia Vital Components Co., Ltd., Sinjhuang, Taipei County (TW)

( * ) Notice: Subject to any disclaimer, the term of this patent is extended or adjusted under 35 U.S.C. 154(b) by 794 days.

(21) Appl. No.: 12/124,419

(22) Filed: May 21, 2008

(65) Prior Publication Data

US 2009/0288806 A1 Nov. 26, 2009

(51) Int. Cl.
*F28F 7/00* (2006.01)
*H05K 7/20* (2006.01)

(52) U.S. Cl. ...................... 165/80.3; 165/185
(58) Field of Classification Search ............... 165/80.3, 165/185, 104.33; 361/697, 702, 703, 709, 361/710; 174/16.3
See application file for complete search history.

(56) References Cited

U.S. PATENT DOCUMENTS

| | | | |
|---|---|---|---|
| 6,662,412 B2 * | 12/2003 | Chuang et al. ............... | 24/457 |
| 6,714,415 B1 * | 3/2004 | Shah ........................ | 361/704 |
| 6,755,242 B2 * | 6/2004 | White ....................... | 165/80.3 |
| 7,520,313 B2 * | 4/2009 | Lai et al. .................. | 165/80.3 |
| 2002/0018336 A1 * | 2/2002 | Liang et al. ................ | 361/697 |
| 2005/0207119 A1 * | 9/2005 | Huang ...................... | 361/697 |
| 2007/0121293 A1 * | 5/2007 | Hong et al. ................ | 361/697 |
| 2007/0242433 A1 * | 10/2007 | Lin et al. .................. | 361/697 |

* cited by examiner

*Primary Examiner* — Tho V Duong

(57) ABSTRACT

A heat radiating unit in the form of a heat sink includes a contact section arranged on a central portion of an end face of the heat sink for contacting with a heat source, and having more than one extension plate outward extended therefrom; a first heat-dissipating section composed of multiple curved radiation fins outward extended from two opposite sides of the contact section to provided increased heat radiating areas; and a second heat-dissipating section composed of multiple straight fins outward extended from another two opposite sides of the contact section and outer surfaces of the extension plates. The contact section conducts heat generated by the heat source to the first and second heat-dissipating sections, through which airflow produced by a cooling fan flows to carry the heat away from the heat sink in multiple directions to achieve enhanced heat-dissipating effect.

3 Claims, 3 Drawing Sheets

(A)

(B)

(A)

(B)

HEAT RADIATING UNIT

FIELD OF THE INVENTION

The present invention relates to a heat radiating unit, and more particularly to a heat sink which combines differently configured radiation fins, so that heat-carrying airflow may be guided out of the heat sink in multiple directions.

BACKGROUND OF THE INVENTION

With the highly developed semiconductor technology, the currently available integrated circuits (ICs) have a largely reduced volume than before. To enable the ICs to process more data, the number of elements and components included in the current ICs is often several times of that in the conventional ICs having the same volume. However, heat produced by the ICs during operation thereof increases with the growing number of electronic elements and components in the ICS. For example, the heat produced by a common central processing unit (CPU) at full working load is high enough for burning out the whole CPU. Therefore, it is important to develop effective heat radiating means for the ICs.

Generally, a heat sink is made of a metal material with high heat conductivity. In addition to the mounting of a cooling fan to carry away the heat produced by heat-producing elements, the heat sink in the form of a radiating fin assembly is frequently used to obtain an enhanced heat radiating effect. In some other cases, heat pipes are further provided on the heat sink to more quickly transfer and dissipate heat, so that products with ICs are protected against burning out.

FIG. 1 is a perspective view showing a conventional rectangular heat sink 1. Multiple radiation fins 11 are arranged in parallel to two longer sides of the heat sink 1 and equally spaced from one another. The heat sink 1 has a base 12 for directly contacting with a heat source 1A to conduct heat produced by the heat source to a main body of the heat sink 1, so that the heat is radiated from the radiation fins 11. The conventional heat sink 1 has a plurality of radiation fins 11. When the heat produced by the heat source is conducted from the heat source to the radiation fins 11 of the heat sink 1, the heat is outward diffused via gaps 111 between the radiation fins 11 and dissipates. The radiation fins 11 themselves have insufficient heat-radiating areas. Moreover, the gaps 111 between the radiation fins 11 are quite narrow and extended straightly toward two opposite sides of the heat sink 1. Under these circumstances, the conventional heat sink 1 only provides narrow spaces for dissipating heat in only two opposite horizontal directions. As a result, the conventional heat sink 1 has low ventilating efficiency which directly leads to poor heat-dissipating efficiency. Therefore, the heat produced by the heat source can be hardly effectively dissipated, and tends to stagnate around the heat sink 1. In a worse condition, the heat source 1A will become damaged due to overheating. In brief, the conventional heat sink 1 has the following disadvantages:
1. The conventional heat sink has only very small heat-radiating areas.
2. The conventional heat sink has only two opposite air outlets which are insufficient for dissipating the heat. Therefore, the heat is likely to stagnate around the heat sink or the heat source without being easily and efficiently dissipated.
3. The conventional heat sink has poor heat-dissipating efficiency.

It is therefore tried by the inventor to develop an improved heat radiating unit to solve the above problems with the conventional heat sink.

SUMMARY OF THE INVENTION

A primary object of the present invention is to provide a heat radiating unit having heat-dissipating sections outward extended from a main body of the heat sink to provide increased heat-dissipating areas on the heat sink.

Another object of the present invention is to provide a heat radiating unit having multiple heat-dissipating sections to guide heat-carrying airflow out of the heat sink in multiple directions, so that heat generated by a heat source can be quickly dissipated from the heat sink into surrounding air in highly enhanced efficiency.

To achieve the above and other objects, the heat radiating unit according to the present invention is in the form of a heat sink. A central portion of upper or lower end face of the heat sink is configured as a contact section for directly contacting with a heat source and conducting heat generated by the heat source to the heat sink. One or more extension plates are outward extended from an outer periphery of the contact section to divide the heat sink into several equal parts. In addition, a first heat-dissipating section and a second heat-dissipating section are separately outward extended from two pairs of opposite sides the outer periphery of the contact section. The first heat-dissipating section is arranged along two longer sides between two shorter sides of the heat sink. For the first heat-dissipating section to have increased heat-radiating areas, the first heat-dissipating section is composed of multiple curved radiation fins outward extending from the outer periphery of the contact section. Since the curved radiation fins corresponds to the wind shear angle of the airflow blown from a cooling fan to the heat sink, the airflow can flow through the radiation fins more quickly to carry more heat away from the heat sink. The curved radiation fins can have forked free ends to form multiple extension ends for further increasing the heat-radiating area of the first heat-dissipating section. The second heat-dissipating section is composed of multiple straight fins outward extended from the outer periphery of the contact section and outer surfaces of the extension plates.

Since the heat sink of the present invention combines curved and straight radiation fins, increased heat radiating areas may be provided on the heat sink and the airflow produced by the cooling fan may be best guided through the radiation fins to cool down the heat sink, enabling the heat generated by the heat source to quickly dissipate at high efficiency.

According to the above, the heat sink of the present invention has the following advantages: (1) increased heat-radiating areas are created; (2) better heat-dissipating efficiency is achieved; (3) heat dissipates quickly without stagnating around the heat sink; (4) heat is carried away from the heat sink in multiple directions; and (5) airflow from the cooling fan may smoothly flow through the radiation fins.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
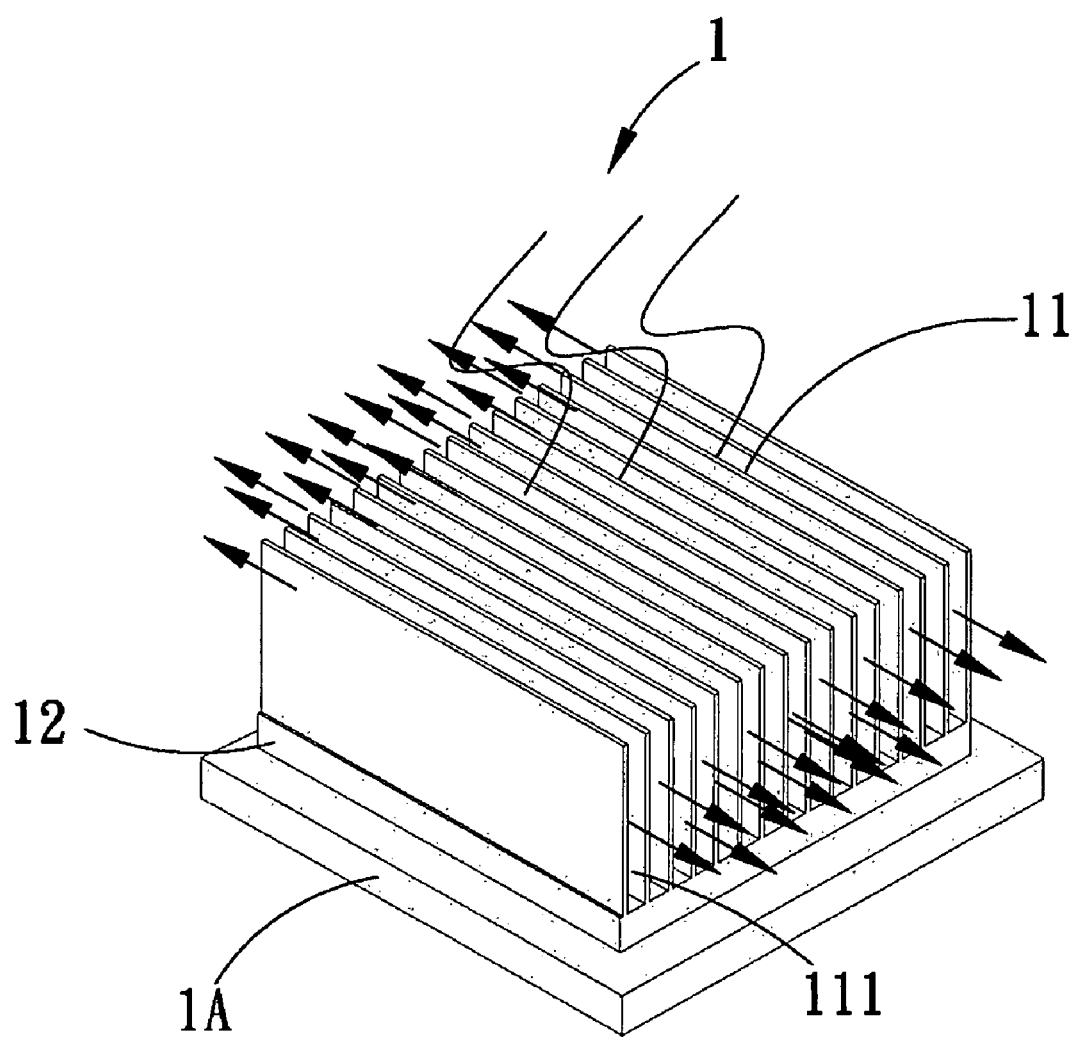
FIG. 1 is a perspective view of a conventional rectangular heat sink.
Figure 2:
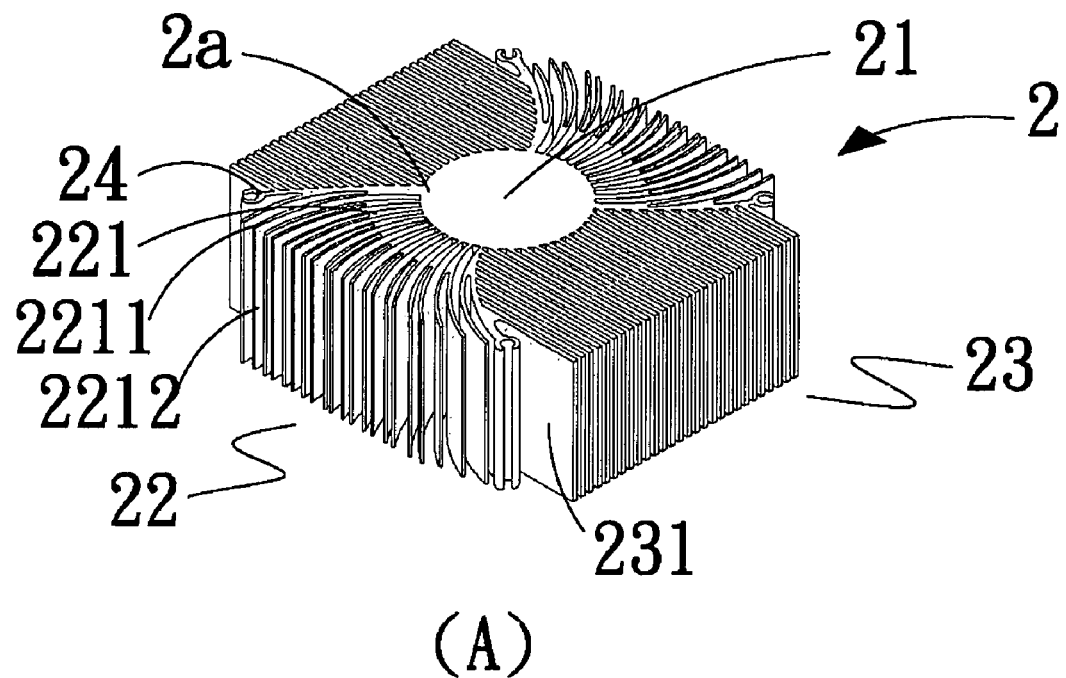
FIG. 2A is a top perspective view of a heat radiating unit according to a preferred embodiment of the present invention.
FIG. 2B is a bottom perspective view of the heat radiating unit of FIG. 2A.
Figure 2:
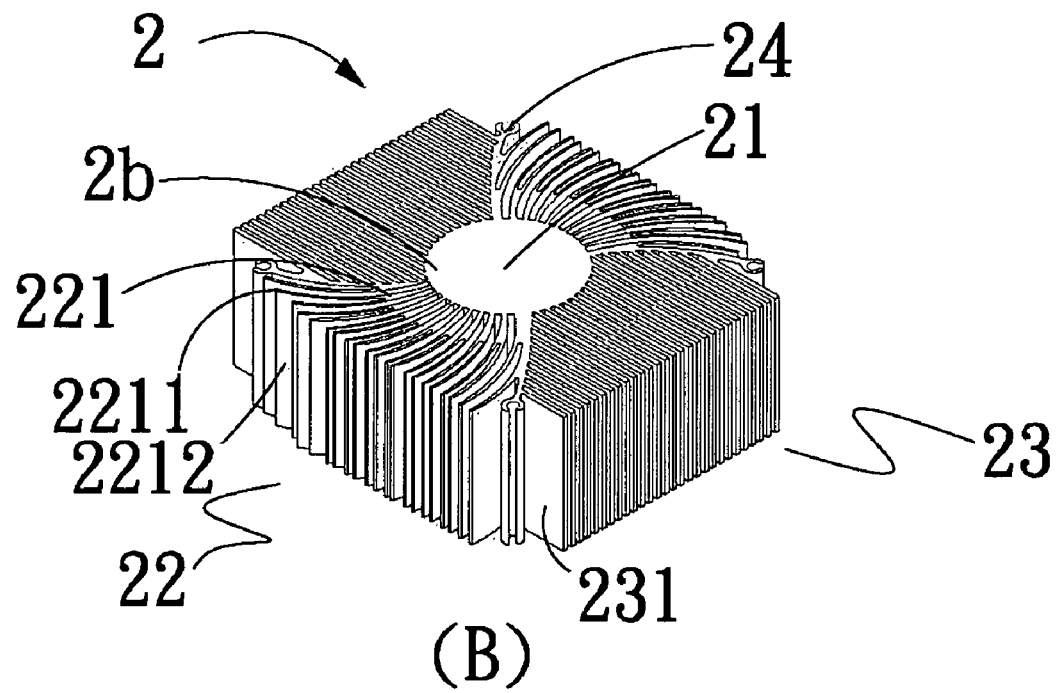

Please refer to FIGS. 2A and 2B that are top and bottom perspective views, respectively, of a heat radiating unit 2 according to a preferred embodiment of the present invention. In this preferred embodiment, the heat radiating unit 2 is a heat sink. As can be clearly seen from FIGS. 2A and 2B, the heat sink 2 of the present invention has an upper end face 2a and a lower end face 2b. A central portion of at least one of the upper end surface 2a and the lower end face 2b is formed with a contact section 21 for contacting with a heat source (not shown) and conducting heat generated by the heat source. The contact section 21 has one or more extension plates 24 outward extended therefrom. In addition, a first heat-dissipating section 22 and a second heat-dissipating section 23 are outward extended from an outer periphery of the contact section 21. The first heat-dissipating section 22 is composed of multiple curved radiation fins 221 outward extended from the outer periphery of the contact section 21. The first heat-dissipating section 22 is arranged along two opposite longer sides of the heat sink 2 to locate between two opposite shorter sides of the heat sink 2. Since a distance from the outer periphery of the contact section 21 to any of the longer sides of the heat sink 2 is shorter, the radiator fins 221 are designed to have a curved configuration, which enables the radiation fins 221 to have increased heat-radiating areas, compared to other configuration. Furthermore, such curved configuration meets the wind shear angle of the airflow created by a cooling fan (not shown), so that a better heat-dissipating effect may be achieved. Alternatively, the curved radiation fins 221 may have forked free ends to form multiple extension ends 2211 for further increasing the heat-radiating area of the first heat-dissipating section 22.

The second heat-dissipating section 23 is composed of multiple straight fins 231 outward extended from the outer periphery of the contact section 21 and outer surfaces of the extension plates 24 between the two longer sides of the heat sink 2. The extension plates 24 divide the heat sink 2 into several equal parts. In this embodiment, the heat sink 2 has four extension plates 24 and is divided into four equal parts. However, the heat sink 2 may have other different number of extension plates 24 and be alternatively divided into two, six, or eight equal parts without being specifically limited. According to the above arrangements, the first and second heat-dissipating sections 22, 23 are radially outward extended from the contact section 21 to largely increase the heat-dissipating area of the heat sink 2. In addition, the radiation fins 221, 231 function to guide the heat-carrying airflow to flow outward in all directions. Accordingly, the heat is more effectively diffused outward and dissipated. In contrast to the conventional heat sink 1, the heat sink 2 of the present invention achieves much better heat-dissipating effect.

Figure 3:
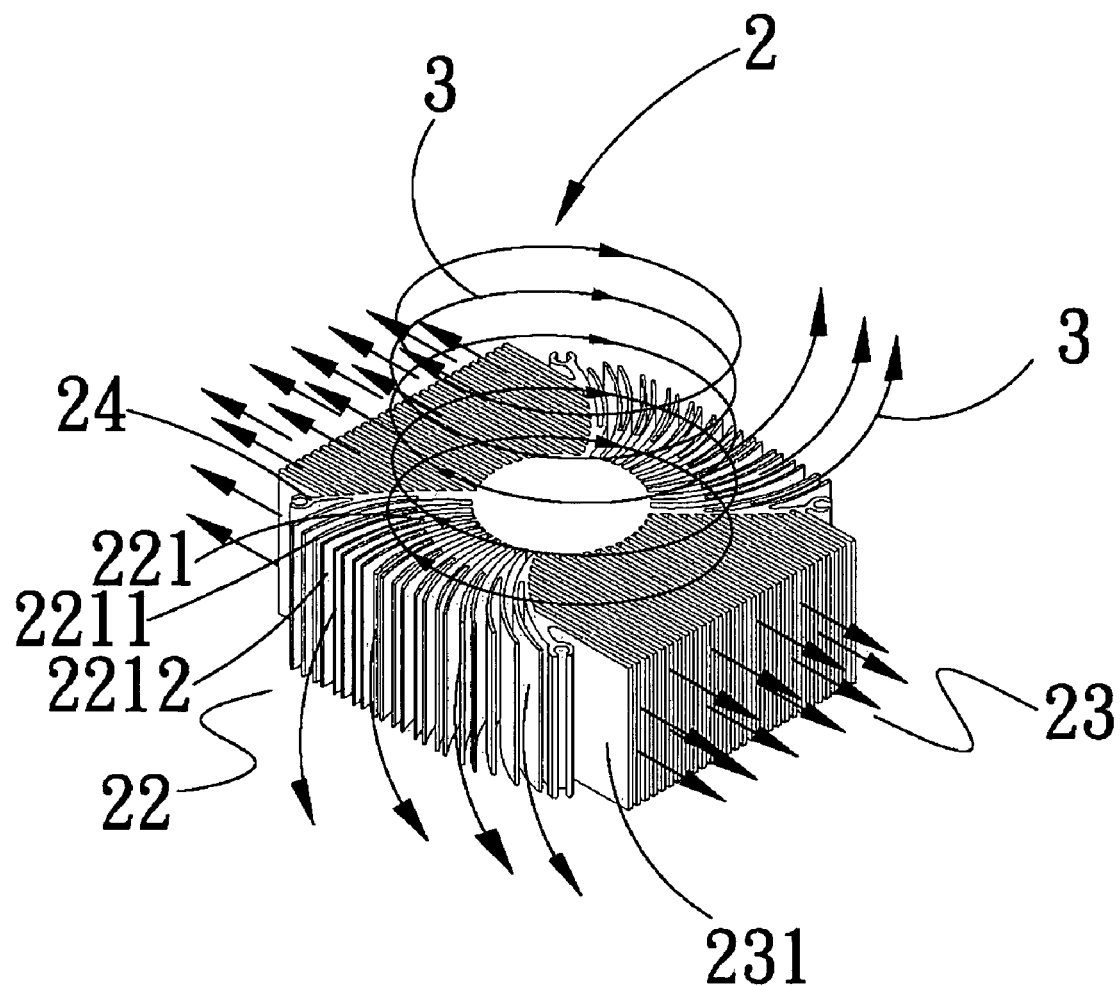
FIG. 3 shows the working manner of the heat radiating unit according to the preferred embodiment of the present invention.

Please refer to FIG. 3 that shows the working manner of the heat radiating unit according to the preferred embodiment of the present invention. When a cooling fan (not shown) creates airflow 3 to cool down the heat sink 2, a portion of the airflow 3 is blown to the first heat-dissipating section 22 to carry away the heat absorbed by the heat sink 2. The curved radiation fins 221 of the first heat-dissipating section 22 guide the airflow 3 to flow from radially inner ends of the radiation fins 221 to heat-radiating faces 2212 of the radiation fins 221. Since the curved configuration of the radiation fins 221 is in conformity with the wind shear angle of the airflow 3 created by the cooling fan (not shown), the airflow 3 is able to reach the entire heat-radiating faces 2212 of the radiation fins 221 to achieve the best possible cooling effect. Then, the heat is carried by the airflow 3 away from the heat sink 2 via the free ends of the radiation fins 221 and dissipates into surrounding air.

On the other hand, another part of the airflow 3 blown to the second heat-dissipating section 23 is guided by the radiating fins 231 to quickly flow from radially inner ends to the free ends thereof to carry the heat away from the heat sink 2.

The extension plates 24 may be outward extended from the contact section 21 in a curved pattern or a straight pattern. In the case of having four extension plates 24, the radiation fins 221 of the first heat-dissipating section 22 and the radiation fins 231 of the second heat-dissipating section 23 are together divided into total four equal parts. Since the radiation fins 221, 231 are substantially radially outward extended from the contact section 21, the airflow 3 may be quickly guided by the radiation fins 221, 231 to flow outward in four different directions. Therefore, with the above arrangements, the airflow 3 can be exactly controlled to diffuse outward, and heat absorbed by the heat sink 2 may be completely carried by the airflow 3 away from the heat sink 2 without stagnating therearound. As a result, an improved heat-dissipating effect is achieved.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A heat radiating unit configured as a heat sink, comprising:
   a contact section being arranged at a central portion of the heat sink for contacting with a heat source, and a plurality of extension plates extended outward from the contact section to divide the heat sink into a plurality of parts;
   a first heat-dissipating section being composed of multiple curved radiation fins outward extended from an outer periphery of the contact section; and
   a second heat-dissipating section being composed of multiple straight fins outward extended from the outer periphery of the contact section and outer surfaces of the extension plates; and the plurality of extension plates are generally the same height as the fins;
   wherein, heat generated by the heat source is conducted by the contact section to a main body of the heat sink, and the heat conducted to the heat sink is outward transferred to the first and second heat-dissipating sections and dissipates into surrounding air; and
   wherein the radiation fins of the first heat-dissipating section each have a forked free end that extends the full height of the fins to thereby form a plurality of extension ends that provide increased heat-radiating area for the heat sink.

2. The heat radiating unit as claimed in claim 1, wherein the contact section is arranged on one of a lower and an upper end face of the heat sink.

3. The heat radiating unit as claimed in claim 1, wherein the extension plates are outward extended from the contact section in a pattern selected from the group consisting of a curved pattern and a straight pattern.

* * * * *